(12) United States Patent
Licausi et al.

(10) Patent No.: US 9,054,052 B2
(45) Date of Patent: Jun. 9, 2015

(54) METHODS FOR INTEGRATION OF PORE STUFFING MATERIAL

(71) Applicant: GLOBALFOUNDRIES Inc., Grand Cayman (KY)

(72) Inventors: Nicholas Vincent Licausi, Watervliet, NY (US); Errol Todd Ryan, Clifton Park, NY (US); Ming He, Slingerlands, NY (US); Moosung M. Chae, Englewood Cliffs, NJ (US); Kunaljeet Tanwar, Slingerlands, NY (US); Larry Zhao, Niskayuna, NY (US); Christian Witt, Woodbridge, CT (US); Ailian Zhao, Slingerlands, NY (US); Sean X. Lin, Watervliet, NY (US); Xunyuan Zhang, Albany, NY (US)

(73) Assignee: GLOBAL FOUNDRIES INC., Grand Cayman (KY)

( * ) Notice: Subject to any disclaimer, the term of this patent is extended or adjusted under 35 U.S.C. 154(b) by 64 days.

(21) Appl. No.: 13/903,802

(22) Filed: May 28, 2013

(65) Prior Publication Data

US 2014/0353802 A1 Dec. 4, 2014

(51) Int. Cl.
| H01L 21/314 | (2006.01) |
| H01L 21/308 | (2006.01) |
| H01L 21/32  | (2006.01) |
| H01L 29/06  | (2006.01) |

(52) U.S. Cl.
CPC ............ *H01L 21/314* (2013.01); *H01L 21/308* (2013.01); *H01L 21/32* (2013.01); *H01L 29/06* (2013.01)

(58) Field of Classification Search
USPC .................. 257/751, 632, 758; 438/422, 407
See application file for complete search history.

(56) References Cited

U.S. PATENT DOCUMENTS

| 7,538,028 | B2 * | 5/2009 | Sandu et al. ................. 438/638 |
| 7,795,142 | B2 * | 9/2010 | Masuda et al. .............. 438/637 |
| 2004/0150075 | A1 * | 8/2004 | Kaji ............................. 257/632 |
| 2004/0175935 | A1 * | 9/2004 | Abell ........................... 438/637 |
| 2007/0111535 | A1 * | 5/2007 | Yu et al. ....................... 438/758 |
| 2008/0099918 | A1 * | 5/2008 | Streck et al. ................. 257/751 |

* cited by examiner

*Primary Examiner* — Marc Armand
*Assistant Examiner* — Quinton Brasfield
(74) *Attorney, Agent, or Firm* — Heslin Rothenberg Farley & Mesiti, P.C.

(57) ABSTRACT

A process is provided for methods of reducing damage to an ultra-low k layer during fabrication. In one aspect, a method includes: providing a cured ultra-low k film containing pores filled with a pore-stuffing material; and modifying an exposed surface of the ultra-low k film to provide a modified layer in the ultra-low k film. In another aspect, a semiconductor device comprising a modified layer on a surface of an ultra-low k film is provided.

17 Claims, 3 Drawing Sheets

METHODS FOR INTEGRATION OF PORE STUFFING MATERIAL

FIELD OF THE INVENTION

The present invention generally relates to semiconductor devices and methods of fabricating semiconductor devices, and more particularly, to methods of reducing damage to an ultra-low k layer during fabrication.

BACKGROUND OF THE INVENTION

Ultra-low k (ULK) dielectric materials possess many properties desired in semiconductors. For instance, a layer, or film, of ultra-low k dielectric material may contain pores within the layer that help to reduce the capacitance of the semiconductor. However, the presence of these pores also necessarily decreases the strength of the film, resulting in a decrease in the film's stability during the semiconductor patterning process. The more pores present in the film, the greater the resulting damage to the ultra-low k dielectric material during processing.

There are currently a number of challenges related to the reactive ion etching (RIE) and chemical mechanical planarization (CMP) steps. Often, the top surface of the ultra-low k layer is damaged during dielectric hard mask deposition. Additionally, CMP stopping in ultra-low k layer is difficult because the ultra-low k is porous and soft, leading to a less-than-ideal CMP height uniformity. This further translates into copper interconnect height uniformity issues and increased interconnect property variability.

There are currently many advantages to using a chemical vapor deposition (CVD) or atomic layer deposition (ALD) deposited liner material in trenches formed in the ultra-low k layer. However, these deposition techniques often lead to precursor penetration deep into the ultra-low k layer, which degrades the electrical isolation between neighboring conductors.

Existing techniques for strengthening the ultra-low k layer include stuffing the pores in the layer with a substance during the subsequent processing steps. Frot et al. (*Adv. Mater.* 2011, 23, 2828-2832) describe filling the pores of an ultra-low k layer with an organic polymer, then subsequently removing the organic polymer, to mitigate the effects of patterning and other downstream processing steps. However, this removal of the organic material may lead to a weakening of the liner material in trenches formed in the ultra-low k layer.

Accordingly, a need exists for a process of protecting the integrity of the ultra-low k layer during fabrication without sacrificing the desired properties of the ultra-low k layer.

BRIEF SUMMARY

The shortcomings of the prior art are overcome and advantages are provided through the provision, in one aspect, of a method which includes: providing a cured, porous ultra-low k film, in which the pores of the film are filled with a pore-stuffing material; and modifying an exposed surface of the ultra-low k film to provide a modified layer in the ultra-low k film.

In another aspect, disclosed is a semiconductor device which has a modified layer on at least one surface of an ultra-low k film.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

Reference is made below to the drawings, which are not drawn to scale for ease of understanding, wherein the same reference numbers used throughout different figures designate the same or similar components.

Generally stated, disclosed herein is a method of reducing damage to an ultra-low k layer during fabrication of a semiconductor device by forming a modified layer on at least one surface of an ultra-low k film. The method includes, in one aspect, providing a cured ultra-low k film which has pores filled with a pore-stuffing material and modifying an exposed surface of the ultra-low k film to form a modified layer on at least one surface of the ultra-low k film. This method provides benefits to a number of issues in back end of line processing. Overall it serves to help preserve the k-value of ultra-low k films. Specifically, this method aids in issues related to the use of CVD/ALD liner deposition, stopping chemical mechanical planarization on the ultra-low k film without overpolishing, and controlling the uniformity of chemical mechanical planarization. Damage to the ultra-low k material may occur with chemical mechanical planarization or plasma deposition by removing carbon from the ultra-low k film, causing it to densify. However, the presence of the modified layer on a surface of an ultra-low k film allows for better control of the stopping of chemical mechanical planarization, prevents damage by the cap deposition, and prevents metal diffusion (for instance, from atomic layer deposition or chemical vapor deposition) into the pores of the ultra-low k film. Additionally, by modifying the pores at the interface (that is, the surface of the ultra-low k layer), the interface becomes smoother, facilitating thinner liner deposition.

Figure 1:
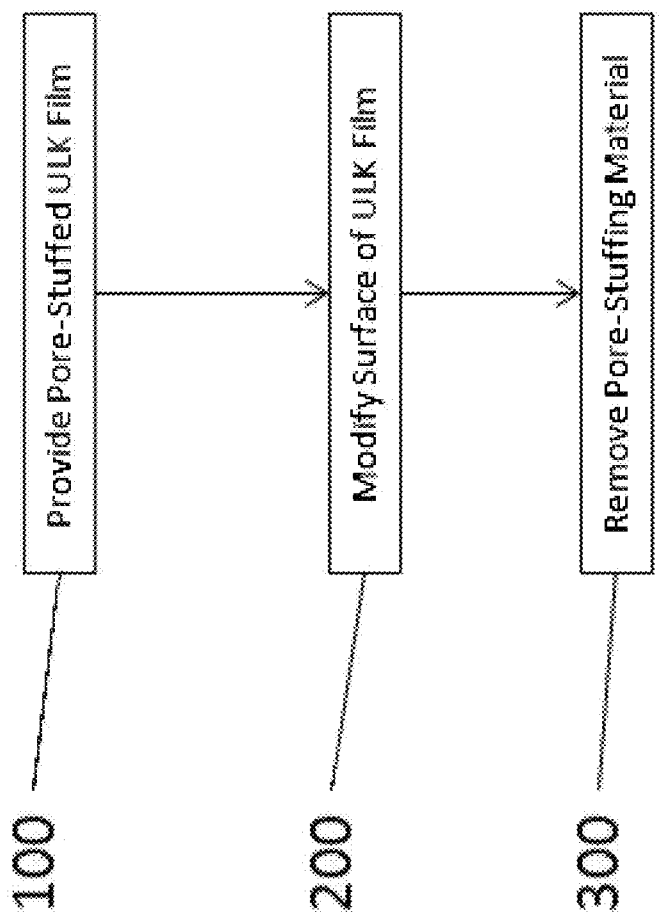
FIG. 1 depicts one embodiment of a process for modifying a surface of an ultra-low k film, in accordance with one or more aspects of the present invention.

FIG. 1 depicts a process overview of one embodiment of the modification process. As shown in FIG. 1, the modification process starts with obtaining an ultra-low k film that contains pores filled with a pore-stuffing material 100. The person of skill will understand that "filled" does not necessarily mean that the entirety of every pore is completely packed with the pore-stuffing material. However, it should be noted that the pore filling should be as homogenous as possible throughout the ultra-low k film to prevent the formation of weak regions. The ultra-low k film may be made of any porous ultra-low k material. Non-limiting examples of these films include spin-on organosilicate glass materials, such as sol-gel films like Nanoglass, and methylsilsesquioxane materials such as JSR LKD-5109. Examples of porous ultra-low k materials deposited by plasma-enhanced chemical vapor deposition (PECVD) include Novellus Coral and Applied Material's Black Diamond. As a non-limiting example, the ultra-low k material may be pSiCOH. The material will typically have a k-value of less than or equal to 3. The porous material may have pores ranging in size from 0.2-3 nm in diameter. The ultra-low k material will typically range in thickness from 25 to 200 nm.

Pore-stuffing material suitable for ultra-low k film pore stuffing should be compatible with the ultra-low k film material and able to withstand the temperatures and pressures used during processing, including the addition and removal of the hardmask, patterning of the ultra-low k layer, addition of a liner in a trench, and/or chemical mechanical planarization. Additionally, the pore-stuffing material must be removable by techniques compatible with back end of line (BEOL) conditions. Examples of suitable pore-stuffing material include, but are not limited to, polymers such as polymethylmethacrylate and other acrylates, polystyrene, polypropylene oxide), and poly(ethylene oxide) derivatives.

As shown in FIG. 1, a thin layer at the surface of the pore-stuffed ultra-low k film is then modified 200 by chemically modifying the pore stuffing material at the surface only, via crosslinking and binding to the ultra-low k matrix; this locks the modified region in place and prevents its removal during further processing. The intention of this step is to react and bind the pore-stuffing material to the ultra-low k backbone only at the interface. The modified pore stuffing material at the surface prevents further modification deeper into the film, which could extensively damage the ultra-low k film and degrade its electrical properties. Modification of the pore-stuffed ultra-low k film may be accomplished by plasma-based processing, UV treatment, electron-beam treatment. The right conditions will induce crosslinking in the pore stuffing material and to the ultra-low k matrix. Parameters such as exposure time could limit the depth of this effect. A wet or vapor chemical exposure with chemicals that may react with the pore stuffing material may also be used. Typically, depletion of carbon from the top layer will make the film more $SiO_2$-like and more dense. The pore-stuffing material prevents this process from occurring deeper into the film than it otherwise would. Further, the modified film will prevent diffusion of vapors into the otherwise porous film.

There is a sacrifice of the electrical properties, including resistance, of the ultra-low k film when it is modified; therefore, it is desirable to keep the modified layer as thin as possible while still bestowing increased strength to the ultra-low k film for protection. In some embodiments, the modified layer is between one and three nanometers thick; this range includes both one nanometer and three nanometers. To be perfectly clear, the language "is formed on the surface of", when referring to the modified layer, indicates that the modification is present at the surface of the ultra-low k layer and extends into the ultra-low k layer to a depth between one and three nanometers. In some embodiments, the modified layer is on the surface of the ultra-low k film distal to (that is, furthest from) a substrate. In some embodiments, the modified layer is on at least one surface of a trench formed in the ultra-low k film. In some embodiments, the modified layer is on all three surfaces—that is, the walls and the floor—of a trench formed in the ultra-low k film. It is contemplated that both the surface of the ultra-low k layer and the surfaces of the trench formed in the ultra-low k layer may be modified.

As shown in FIG. 1, the pore-stuffing material is then removed 300. The removal may be accomplished in a number of ways, including, but not limited to thermal anneal, UV curing, or potentially one of many alternative cures (such as $H_2$ remote plasma, IR layer treatment, and the like).

Figure 2:
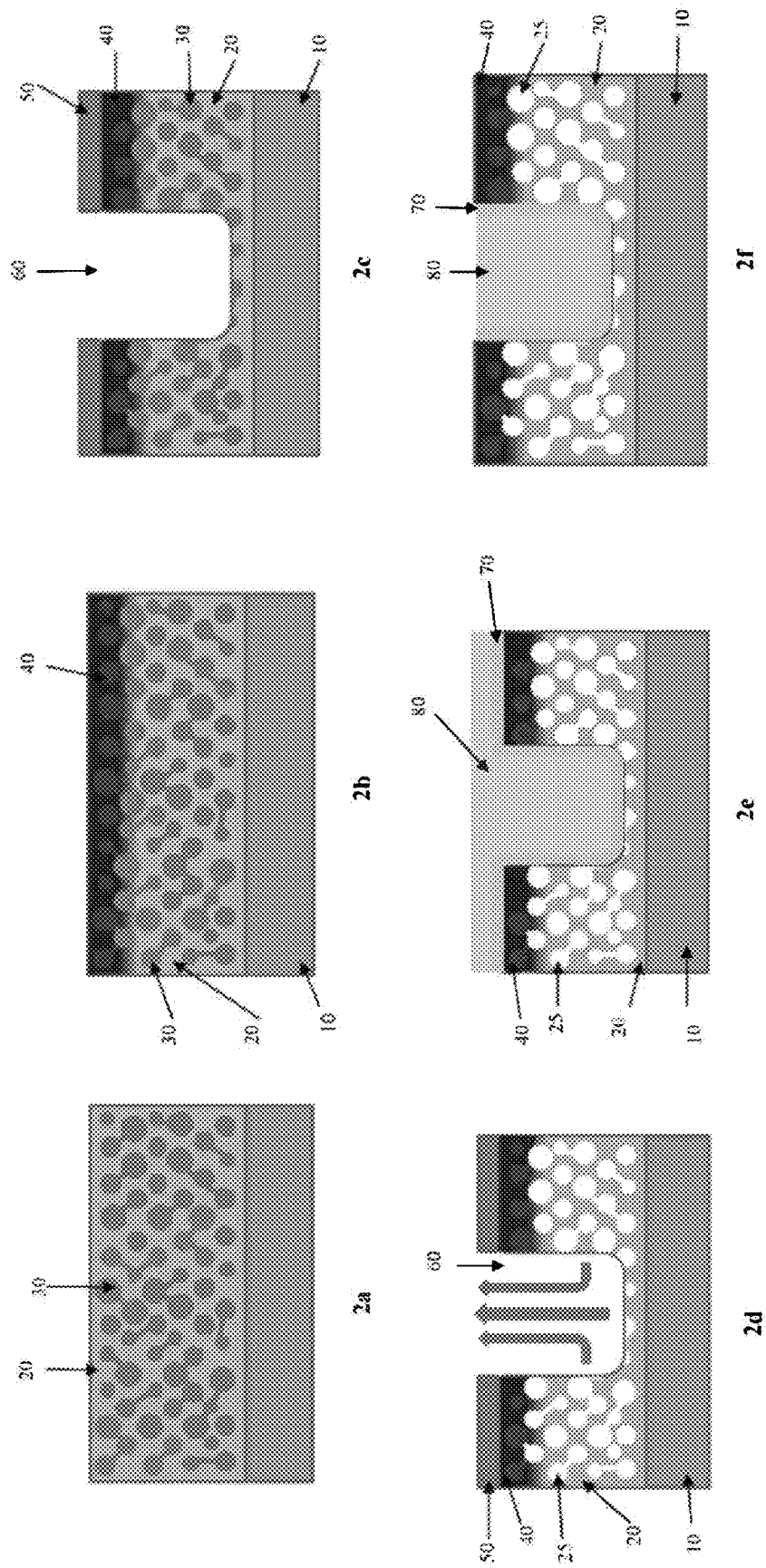
FIG. 2 depicts one embodiment of a process for modifying the surface of an ultra-low k film distal to the substrate, in accordance with one or more aspects of the present invention.

In some embodiments, the modification of the ultra-low k film occurs on the surface of the ultra-low k film distal to the substrate. One such embodiment is shown in FIG. 2. FIG. 2a shows an ultra-low k film 20 on a substrate 10. The ultra-low k film 20 contains stuffed pores 30 as described herein. The surface of the ultra-low k film 20 furthest from the substrate 10 is then modified 200 (see FIG. 1) to provide a modified layer 40, as shown in FIG. 2b. This modified layer helps to prevent deeper damage to the underlying ultra-low k layer during subsequent hard mask deposition (either dielectric hard mask or directly to metal hard mask) as well as dielectric cap deposition after metallization. A hardmask 50 is deposited and patterned and the ultra-low k film 20 is patterned to form a trench 60, as shown in FIG. 2c. This patterning may be done by conventional methods and is not discussed here. FIG. 2d illustrates the pore-stuffing material removal 300 (see FIG. 1), and the now-unstuffed pores 25 remain protected by the modified layer 40. The hardmask 50 is removed and a liner material 70 and a copper interconnect 80 are deposited in the trench 60 and on the modified layer 40, as illustrated in FIG. 2e. The liner material 70 may be any conventional liner material; non-limiting examples include Ta and TaN. Removal is performed using chemical mechanical planarization to polish back the copper 80 overburden and then the liner material 70. This hardmask removal and liner deposition may be done by conventional methods which are not discussed here. The modified layer 40 allows the chemical mechanical planarization to stop on the modified material 40, thus preventing damage to the ultra-low k film 20, as shown in FIG. 2f.

Figure 3:
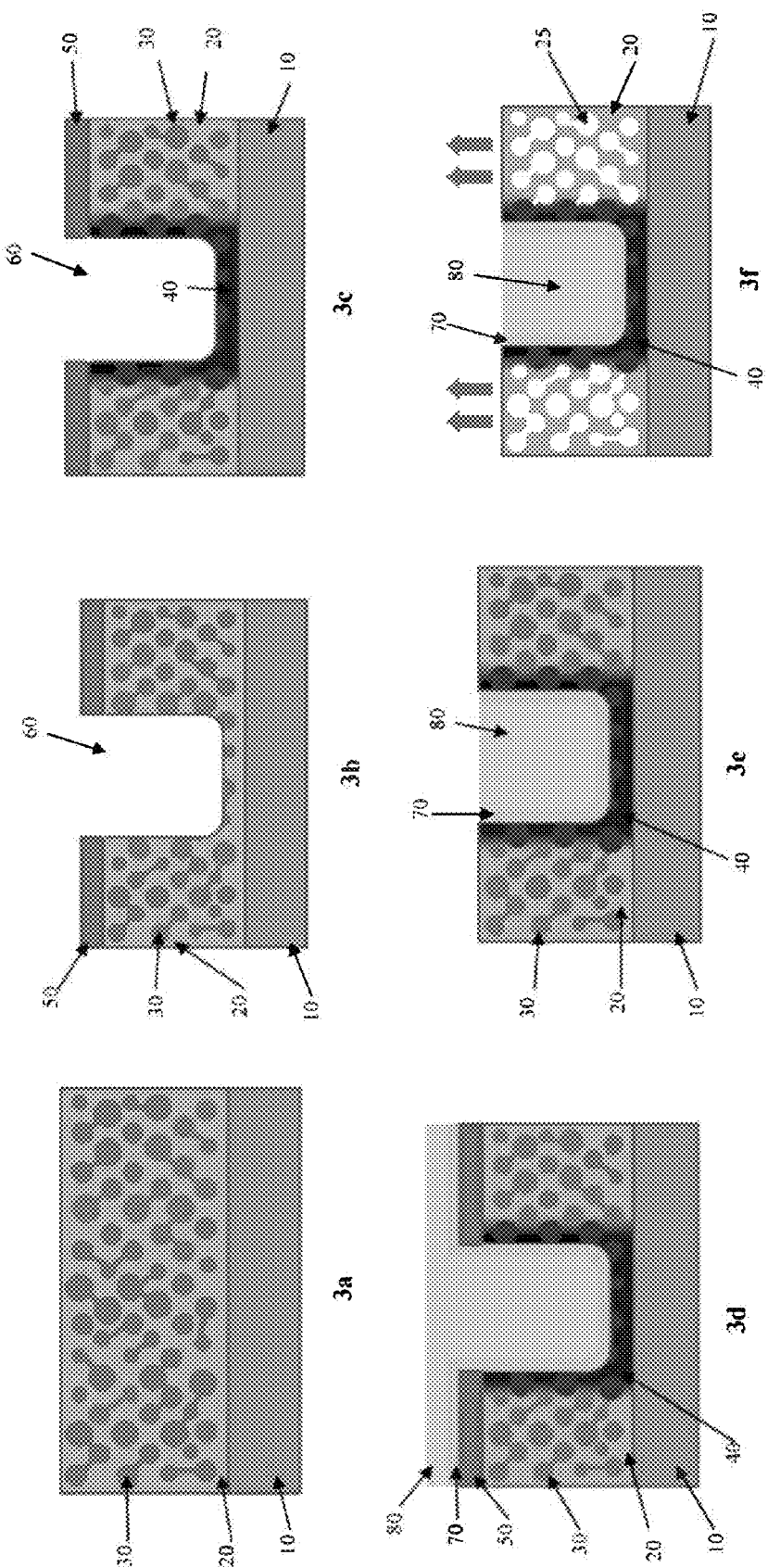
FIG. 3 depicts one embodiment of a process for modifying the surfaces of a trench formed in an ultra-low k film, in accordance with one or more aspects of the present invention.

In some embodiments, the modification of the ultra-low k film occurs on at least one surface of a trench formed in the ultra-low k film. In some embodiments, the modification of the ultra-low k film occurs on all surfaces of a trench formed in the ultra-low k film. A process overview of one such embodiment is disclosed herein and depicted in FIG. 3. FIG. 3a shows a ultra-low k film 20 on a substrate 10. The ultra-low k film 20 contains stuffed pores 30 as described herein. A hardmask 50 is deposited and patterned, and the pore-stuffed ultra-low k film is patterned to form a trench 60, as shown in FIG. 3b. The surfaces of the trench 60 are then modified 200 (see FIG. 1) to provide a modified layer 40 around the trench 60, as shown in FIG. 3c. A liner material 70 and a copper interconnect 80 are deposited in the trench 60 and on the hardmask 50, as illustrated in FIG. 3d. The liner material 70 may be any conventional liner material; non-limiting examples include Ta and TaN. As mentioned supra, the liner material may be deposited, for instance, by CVD or ALD, but these deposition techniques may degrade the electrical isolation between neighboring conductors by allowing for precursor penetration deep into the ultra-low k. The presence of the modified layer 40 mitigates this penetration and allows for a smoother sidewall and thus lower resistivity, in addition to a thinner liner 70. By allowing for a thinner liner, a larger volume of the trench is copper, further reducing the overall interconnect resistance.

Chemical mechanical planarization is then performed to remove the hardmask 50 and excess liner material. The pores remain stuffed 30 until after chemical mechanical planarization, allowing for more controlled stoppage of the chemical mechanical planarization on the ultra-low k layer. This results in cleaner line height uniformity, as compared to chemical mechanical planarization on a standard, unstuffed ultra-low k layer. The pore stuffing material is then removed 300 (see FIG. 1) as discussed supra. The modification is also beneficial for maintaining a stable interface between the liner 70 and the ultra-low k layer 20. Without the modification, the later removal of the pore stuffing material from the ultra-low k layer pores may weaken the liner or make it porous.

In one aspect, disclosed is a semiconductor device that contains a modified layer on at least one surface of an ultra-low k film. In some embodiments, the modified layer is on the surface of the ultra-low k film distal to a substrate. In other embodiments, the modified layer is formed on at least one surface of a trench formed in the ultra-low k film. In some embodiments, the modified layer is on the surface of the ultra-low k film distal to a substrate and on at least one surface of a trench formed in the ultra-low k film. In some embodiments, the modified layer is between one and three nanometers thick.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method, comprising:
   providing a cured ultra-low k film, wherein pores of said film are filled with a pore-stuffing material; and
   cross-linking the pore stuffing material at an exposed surface of said ultra low-k film to provide a modified layer of said cross-linked pore stuffing material in the ultra-low k film.

2. The method of claim 1, wherein the modified layer is between one and three nanometers thick.

3. The method of claim 1, wherein the modified layer is formed on the surface of the ultra-low k film distal to a substrate.

4. The method of claim 3, wherein the formation of the modified layer occurs prior to the addition of a hardmask.

5. The method of claim 1, wherein the modified layer is formed on at least one surface of a trench formed in the ultra-low k film.

6. The method of claim 5, wherein the modified layer is formed on all surfaces of a trench formed in the ultra-low k film.

7. The method of claim 5, wherein the formation of the modified layer occurs after the addition of a hardmask.

8. The method of claim 6, wherein the formation of the modified layer occurs after the addition of a hardmask.

9. The method of claim 1, further comprising removing said pore-stuffing material.

10. The method of claim 1, comprising:
    providing a cured ultra-low k film, wherein pores of said film are filled with a pore-stuffing material;
    cross-linking the pore stuffing material at a surface of said ultra-low k film distal to a substrate to provide a modified layer in the ultra-low k film;
    forming a trench in the ultra-low k film;
    removing said pore-stuffing material;
    lining said trench; and
    smoothing said surface of said of said ultra-low k film by chemical-mechanical planarization.

11. The method of claim 1, comprising:
    providing a cured ultra-low k film, wherein pores of said film are filled with a pore-stuffing material;
    forming a trench in the ultra-low k film;
    cross-linking the pore stuffing material at least one surface of said trench to provide a modified layer in the ultra-low k film;
    lining said trench;
    smoothing the surface of the ultra-low k film distal to a substrate by chemical-mechanical planarization; and
    removing said pore-stuffing material.

12. The method of claim 11, wherein the modified layer is formed on all surfaces of a trench formed in the ultra-low k film.

13. A semiconductor device comprising a layer comprising cross-linked pore-stuffing material on a surface of an ultra-low k film.

14. The semiconductor device of claim 13, wherein said layer comprising cross-linked pore-stuffing material is formed on the surface of the ultra-low k film distal to a substrate.

15. The semiconductor device of claim 13, wherein said layer comprising cross-linked pore-stuffing material is formed on the surface of a trench formed in the ultra-low k film.

16. The semiconductor device of claim 15, wherein said layer comprising cross-linked pore-stuffing material is formed on all surfaces of a trench formed in the ultra-low k film.

17. The semiconductor device of claim 13, wherein said layer comprising cross-linked pore-stuffing material is between one and three nanometers thick.

* * * * *